(12) United States Patent
Noma et al.

(10) Patent No.: US 9,099,841 B2
(45) Date of Patent: Aug. 4, 2015

(54) SEMICONDUCTOR LASER

(75) Inventors: Tsuguki Noma, Kyoto (JP); Miroru Murayama, Kyoto (JP); Satoshi Uchida, Kyoto (JP); Tsutomu Ishikawa, Kyoto (JP)

(73) Assignee: ROHM CO., LTD, Kyoto (JP)

( * ) Notice: Subject to any disclaimer, the term of this patent is extended or adjusted under 35 U.S.C. 154(b) by 131 days.

(21) Appl. No.: 12/734,665

(22) PCT Filed: Oct. 17, 2008

(86) PCT No.: PCT/JP2008/068873
§ 371 (c)(1),
(2), (4) Date: Feb. 3, 2011

(87) PCT Pub. No.: WO2009/063720
PCT Pub. Date: May 22, 2009

(65) Prior Publication Data
US 2011/0128985 A1 Jun. 2, 2011

(30) Foreign Application Priority Data
Nov. 16, 2007 (JP) .................. 2007-298381

(51) Int. Cl.
*H01S 5/00* (2006.01)
*H01S 5/223* (2006.01)
*H01S 5/22* (2006.01)

(52) U.S. Cl.
CPC ............. *H01S 5/2231* (2013.01); *H01S 5/2219* (2013.01); *H01S 5/2227* (2013.01)

(58) Field of Classification Search
CPC ............................ H01S 5/2231; H01S 5/2219
USPC ........................... 372/46.01, 46.011
See application file for complete search history.

(56) References Cited

U.S. PATENT DOCUMENTS

| 5,661,741 A | | 8/1997 | Kakimoto | |
| 5,949,809 A | * | 9/1999 | Ashida | 372/46.01 |
| 5,974,068 A | * | 10/1999 | Adachi et al. | 372/46.01 |
| 2004/0101011 A1 | * | 5/2004 | Kan | 372/45 |

FOREIGN PATENT DOCUMENTS

| JP | 09-283842 A | | 10/1997 | |
| JP | 10-098233 A | | 4/1998 | |
| JP | 2002-124736 A | | 4/2002 | |
| JP | 2005-243945 A | | 9/2005 | |
| JP | 2005243945 A | * | 9/2005 | .............. H01S 5/223 |
| JP | 2006-054426 A | | 2/2006 | |

* cited by examiner

*Primary Examiner* — Julio J Maldonado
*Assistant Examiner* — Joshua King
(74) *Attorney, Agent, or Firm* — Rabin & Berdo, P.C.

(57) ABSTRACT

Provided is a semiconductor laser which has a low operating current and stably oscillates even for high-temperature output. The semiconductor laser is provided with a substrate (10); an n-type clad layer (12) arranged on the substrate (10); an active layer (13) arranged on the n-type clad layer (12); a p-type clad layer (14), which is arranged on the active layer (13) and composed of a compound containing Al and has a stripe-shaped ridge structure to be a current channel; a current block layer (16), which is arranged on the surface of the p-clad layer (14) excluding an upper surface of the ridge structure and composed of a compound containing Al and has an Al composition ratio not more than that of the p-type clad layer (14); and a light absorption layer (17), which is arranged on the current block layer (16) and absorbs light at the laser oscillation wavelength.

9 Claims, 6 Drawing Sheets

(a)

(b)

(c)

SEMICONDUCTOR LASER

TECHNICAL FIELD

The present invention relates to a semiconductor laser and specifically relates to a semiconductor laser including a layer confining current and a layer confining light which are independent of each other.

BACKGROUND ART

Semiconductor lasers used as light sources of optical information processing devices should have long life, not vary widely in threshold current with temperature, and produce little noise. The semiconductor lasers used in the optical information processing devices can be ridge-type semiconductor lasers which have an oscillation wavelength in the red range and includes a current block layer of a double layer structure and the like (for example, see Patent Literature 1).

In a light information processing device including a single-mode semiconductor laser, if a laser beam reflected on an optical disk or the like is incident on the semiconductor laser, the oscillation unstably changes because of the light interference, causing noise. Such noise due to the returned light works against using the semiconductor lasers in light sources for reproduction and recording of optical disks or the like.

In order to reduce the noise due to the returned light, generally, the coherence of the laser light is reduced by modulating the output of the semiconductor laser with a high-frequency superposing circuit. However, this method additionally requires the high-frequency superposing circuit for generating high-frequency current and is not suited for miniaturization of a light information processing device on which the semiconductor laser is mounted. Recently, a so-called self-pulsation laser which periodically changes in output without the extra high-frequency superposing circuit has attracted attention because the self-pulsation laser is suited for miniaturization and is produced at low cost.

However, the self-pulsation laser has a problem of operating as a single mode laser at high temperature. In other words, the conventional self-pulsation laser is guaranteed to have the same effect as that obtained by superposing high frequency current onto a single mode laser only when the laser operates at low temperature.

Patent Citation 1: Japanese Patent Laid-open Publication No. 2002-124736

DISCLOSURE OF INVENTION

Technical Problem

In the light of the aforementioned problems, an object of the present invention is to provide a semiconductor laser which operates at low operating current and stably oscillates even at high temperature.

Solution to Problem

According to an aspect of the present invention is a semiconductor laser, including: a substrate; a first conduction-type cladding layer provided on the substrate; an active layer provided on the first conduction-type cladding layer; a second conduction-type cladding layer which is provided on the active layer and composed of a compound containing Al, the second conduction-type cladding layer including a stripe-shaped ridge structure serving as a current channel; a current block layer which is provided on a surface of the second conduction-type cladding layer except an upper surface of the ridge structure and is composed of a compound containing Al, the current block layer having a composition ratio of Al not higher than that of the second conduction-type cladding layer; and a light absorption layer provided on the current block layer and absorbs light at a laser oscillation wavelength.

Advantageous Effects of Invention

According to the present invention, it is possible to provide a semiconductor laser which operates at low operating current and stably oscillates at high temperature.

REFERENCE SIGNS LIST

Figure 1:
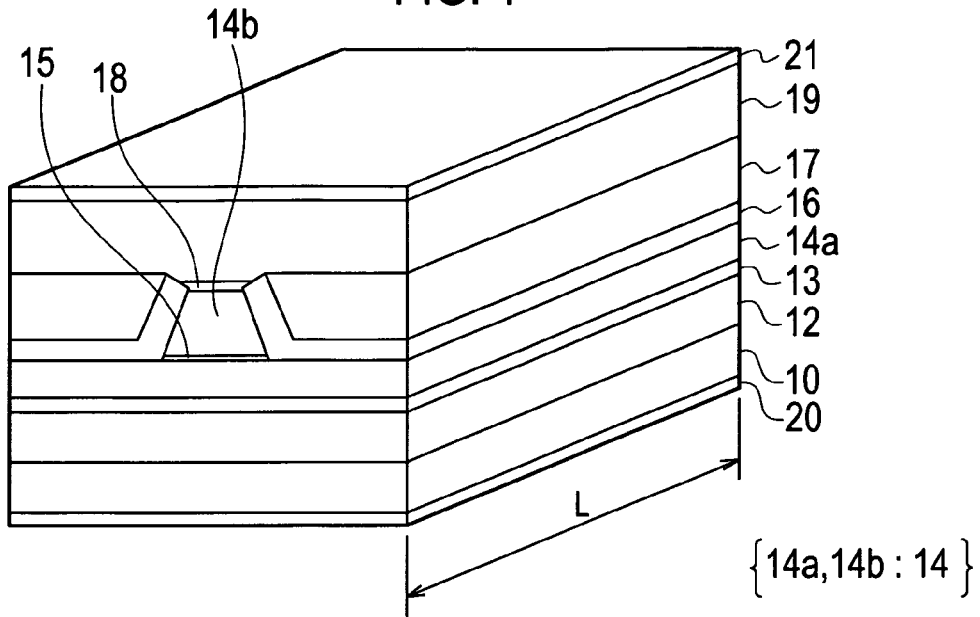
FIG. 1 is a perspective view of a semiconductor laser according to an embodiment of the present invention.

10 . . . SUBSTRATE
12 . . . N-TYPE CLADDING LAYER
13 . . . ACTIVE LAYER
14 . . . P-TYPE CLADDING LAYER
14A . . . FIRST P-TYPE CLADDING LAYER
14B . . . SECOND P-TYPE CLADDING LAYER

15 ... ETCHING STOP LAYER
16 ... CURRENT BLOCK LAYER
17 ... LIGHT ABSORPTION LAYER
18 ... BDR LAYER
19 ... CONTACT LAYER
20 ... N-SIDE ELECTRODE
21 ... P-SIDE ELECTRODE
30 ... MASK

BEST MODE FOR CARRYING OUT THE INVENTION

With reference to the drawings, embodiments of the present invention are described. In the following description of the drawings, same or similar portions are indicated by same or similar reference numerals or symbols. The drawings are schematic, and relationships between thicknesses and planer dimensions, proportions of thicknesses of the layers, and the like are different from actual ones. Accordingly, specific thicknesses and dimensions should be determined with reference to the following description. Moreover, it is certain that some portions in each drawing have different dimensional relationships and different proportions from those of another drawings.

[Embodiment]

Figure 2:
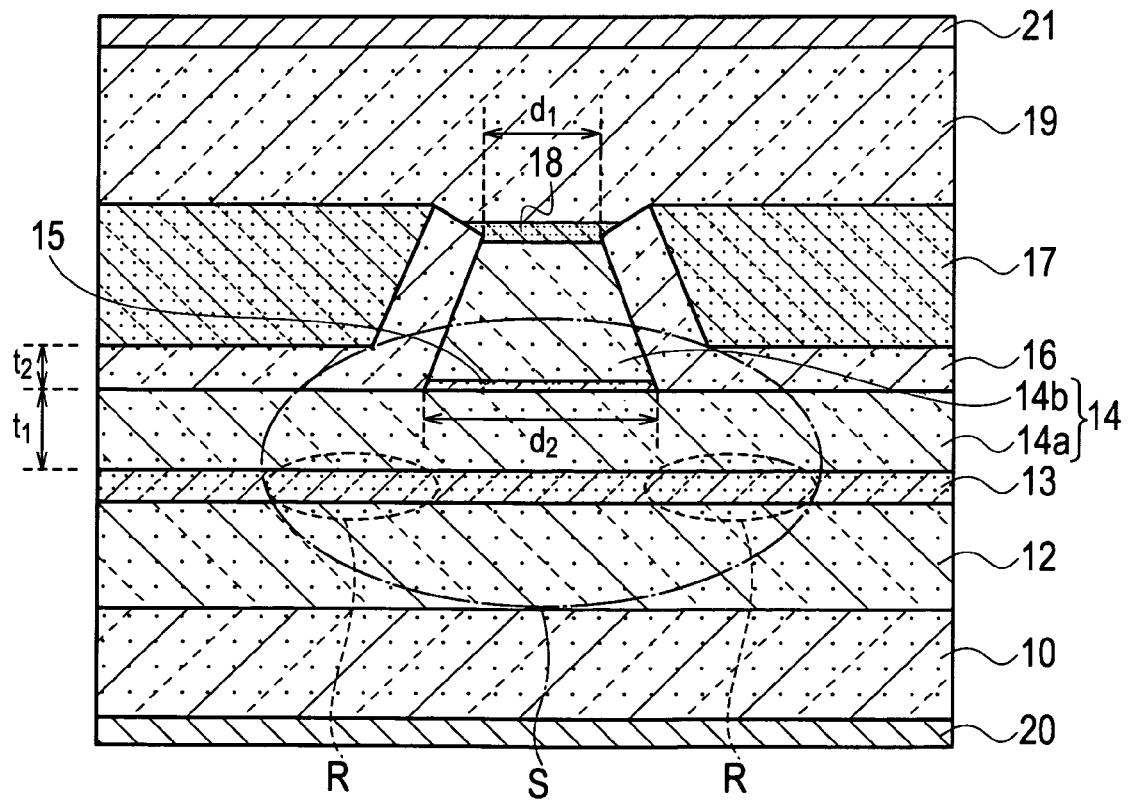
FIG. 2 is a cross-sectional view of the semiconductor laser according to the embodiment of the present invention.

As shown in FIGS. 1 and 2, a semiconductor laser according to an embodiment of the present invention includes: a substrate 10; an n-type (a first conduction-type) cladding layer 12 provided on the substrate 10; an active layer 13 provided on the n-type cladding layer 12; a p-type (a second conduction-type) cladding layer 14 which is provided on the active layer 13 and has a stripe-shaped ridge structure serving as a current channel; a current block layer 16 provided on the surface of the p-type cladding layer 14 except upper surface of the ridge structure; and a light absorption layer 17 provided on the current block layer 16. The p-type cladding layer 14 is composed of a compound containing aluminum (Al). The current block layer 16 is composed of a compound containing Al and has a composition ratio of Al not more than that of the p-type cladding layer 14. The light absorption layer 17 absorbs light at laser oscillation wavelength.

The substrate 10 is a semiconductor substrate composed of a conductive n-type (first conduction-type) gallium arsenic (GaAs) doped with silicon (Si) as an n-type dopant, for example.

The n-type cladding layer 12 is composed of InGaAlP doped with Si as an n-type dopant to a concentration of about $7.0 \times 10^{17}$ cm$^{-3}$, for example. On the n-type cladding layer 12, preferably, an n-type light guiding layer (not shown) is provided, which is composed of InGaAlP doped with Si to a concentration of about $2.3 \times 10^{17}$ cm$^{-3}$ as an n-type dopant and has a role of adjusting light density in the active layer 13.

In the active layer 13, electrons supplied from the n-type cladding layer 12 and holes supplied from the p-type cladding layer 14 are recombined with each other to emit light. The active layer 13 can be composed of, for example, a quantum well (QW) structure which includes a well layer sandwiched by barrier layers having a band gap larger than that of the well layer. The quantum well structure may include a plurality of well layers, or the active layer 13 may be composed of a multiple quantum well (MQW) structure. The active layer 13 of the MQW structure can include 5 to 8 pairs of InGaAlP and indium gallium phosphor (InGaP) layers alternately stacked on each other. The active layer 13 has a thickness of about 15 to 90 nm. On the active layer 13, preferably, a p-type light guiding layer (not shown) is provided, which is composed of InGaAlP doped with magnesium (Mg) to a concentration of about $3.5 \times 10^{17}$ cm$^{-3}$ as a p-type dopant, for example, and takes a role of adjusting the light density in the active layer 13.

The p-type cladding layer 14 is composed of first and second p-type cladding layers 14a and 14b. At the boundary between the first and second p-type cladding layers 14a and 14b, the etching stop layer 15 is provided. The first p-type cladding layer 14a is a flat layer having a thickness $t_1$ (thickness of part of the p-type cladding layer 14 where the ridge structure is not provided) of 200 to 500 nm. The second p-type cladding layer 14b is composed of the stripe-shaped ridge structure having a ridge top width $d_1$ of 1.0 to 3.5 µm, a ridge bottom width $d_2$ of 1.5 to 4.0 µm, and a length (resonator length) L of about 250 to 500 µm in the direction of the stripe. The first and second p-type cladding layers 14a and 14b are composed of InGaAlP doped with Mg to a concentration of about $7.0 \times 10^{17}$ cm$^{-3}$ as a p-type dopant, for example.

The current block layer 16 is transparent and has a function of confining only current but not confining (absorbing) laser light generated at the active layer 13. The current block layer 16 constricts current injected into the active layer 13 to raise the current density of the active layer 13 with the function of confining current. The current block layer 16 needs to be composed of a material not absorbing the laser light generated by the active layer 13 and to be capable of confining the injected current. First, materials satisfying the condition that the material of the current block layer 16 does not absorb the laser light generated at the active layer 13 can include the same material as that of the active layer 13 and a material having a band gap larger than that of the active layer 13. Materials satisfying the condition that the material of the current block layer 16 is capable of confining injected current need to have a band gap larger than that of the p-type cladding layer 14. The composition ratio of Al in the current block layer 16 needs to be set equal to or less than that of the p-type cladding layer 14. Preferably, the difference in the composition ratio of Al between the current block layer 16 and p-type cladding layer 14 is set not more than 5%. The thickness $t_2$ of the current block layer 16 is preferably 100 to 400 nm in order to provide a sufficient current blocking effect. The current block layer 16 is composed of InGaAlP doped with Si to a concentration of about $1.0 \times 10^{18}$ cm$^{-3}$ as an n-type dopant, for example.

The light absorption layer 17 is capable of absorbing the laser light generated at the active layer 13 and confining the laser light with an anti-waveguide effect. The light absorption layer 17 also serves as a current block layer confining the injected current if the light absorption layer 17 is composed of a material having a band gap larger than that of the p-type cladding layer 14. The light absorption layer 17 is composed of GaAs doped with Si to a concentration of about $1.1 \times 10^{18}$ cm$^{-3}$ as an n-type dopant, for example. The light absorption layer 17 needs to have a band gap smaller than that of the active layer 13. The light absorption layer 17 may be p- or n-doped or undoped.

The band discontinuity reduction layer (BDR) 18 is provided on the upper surface of the ridge structure as the second p-type cladding layer 14b. The BDR layer 18 is composed of InGaP doped with Mg to a concentration of about $4.0 \times 10^{18}$ cm$^{-3}$ as a p-type dopant.

The contact layer 19 is provided on the current block layer 16, light absorption layer 17, and BDR layer 18. The contact layer 19 is a layer on which the p-side electrode 21 is formed and is therefore composed of a layer having a high crystallinity and a high carrier density to easily form an ohmic contact with the material of the electrode. The contact layer 19 is composed of GaAs doped with zinc (Zn) to a concentration of about $1.5 \times 10^{19}$ cm$^{-3}$ as a p-type dopant, for example.

The n-side electrode 20 is provided on a surface of the substrate 10 opposite to the surface where the n-type cladding layer 12 is provided and is in an ohmic contact to the substrate 10. The n-side electrode 20 can be an AuGe/Ni/At electrode, an Au/Sn/Cr electrode, or the like.

The p-side electrode 21 is provided on the upper surface of the contact layer 19 and is in ohmic contact to the contact layer 19. The p-side electrode 21 can be a Ti/Pt/Au electrode, an Au/Cr electrode, or the like.

Hereinafter, a method of manufacturing the semiconductor laser according to the embodiment is described with reference to FIGS. 3(a) to 3(c).

Figure 3:
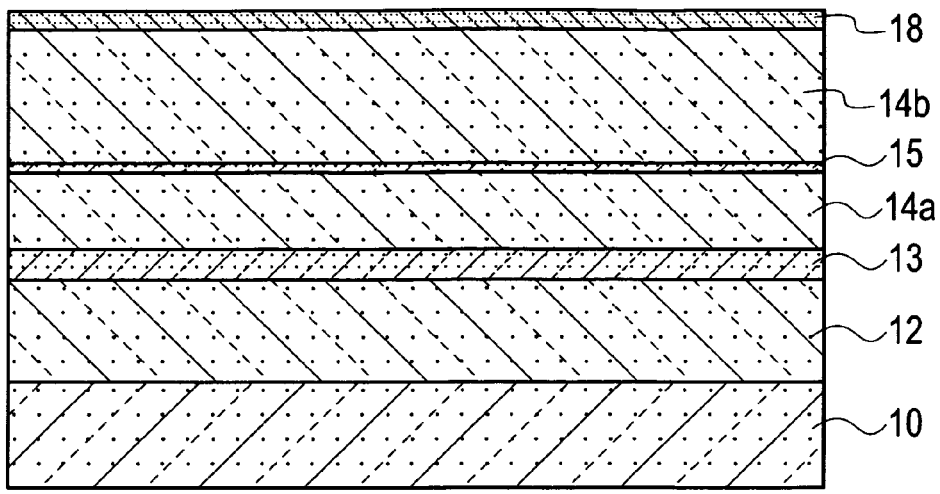
FIGS. 3(a) to 3(c) are cross-sectional process views showing a method of manufacturing the semiconductor laser according to the embodiment of the present invention.
Figure 3:
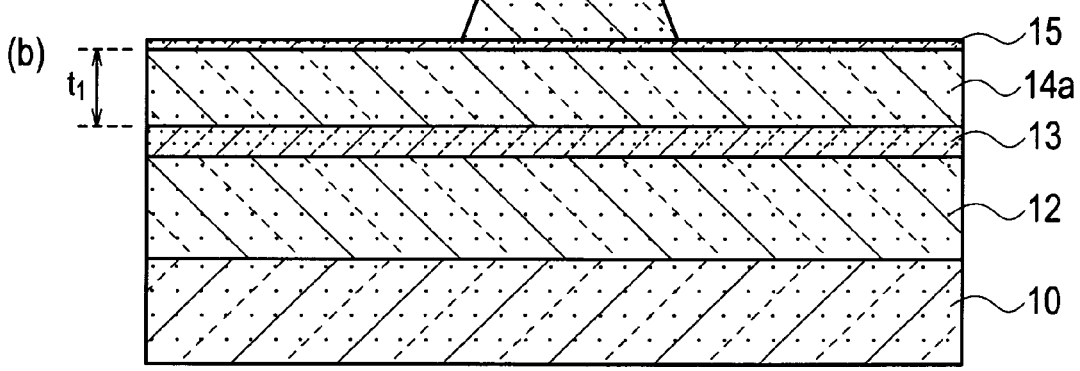
Figure 3:
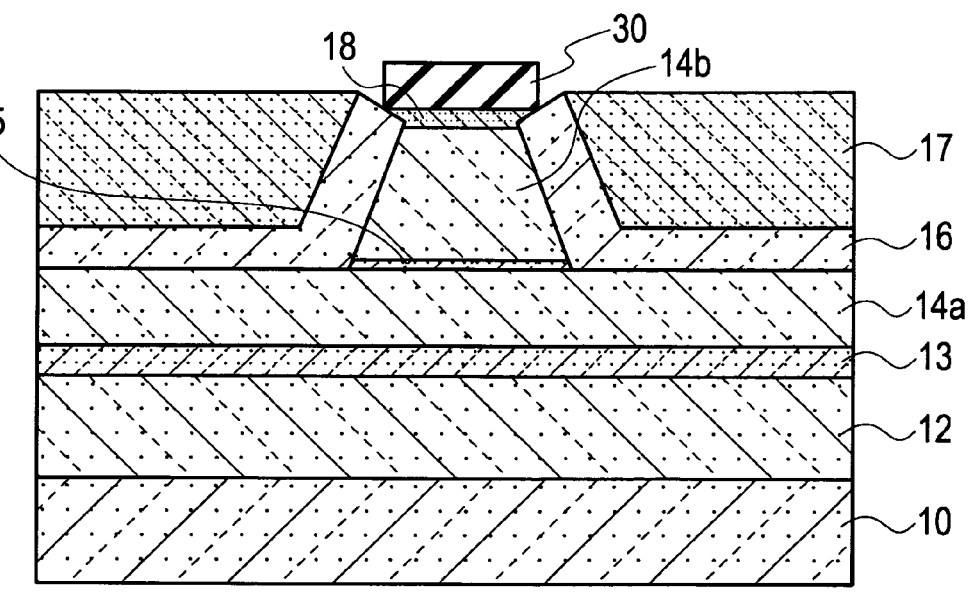

First, as shown in FIG. 3(a), the n-type cladding layer 12, active layer 13, first p-type cladding layer 14a, etching stop layer 15, second p-type cladding layer 14b, and BDR layer 18 are sequentially epitaxially grown on the n-type GaAs substrate 10 by metal organic chemical vapor deposition (MOCVD).

Next, as show in FIG. 3(b), a mask 30 used for forming the ridge structure on the BDR layer 18 is formed. The BDR layer 18 and second p-type cladding layer 14b are etched through the mask 30. This etching is prevented from proceeding deeper into the etching stop layer 15. Etching to the depth of the etching stop layer 15 in such a manner allows distance $t_1$ from the bottom of the ridge structure to the active layer 13 to be maintained constant, thus stabilizing the laser characteristics. Remaining part of the etching stop layer 15 is then removed except that existing at the bottom of the ridge structure.

Next, as shown in FIG. 3(c), the current block layer 16 and light absorption layer 17 are sequentially epitaxially grown on the first p-type cladding layer 14a and side surfaces of the ridge structure of the second p-type cladding layer 14b by MOCVD with the mask 30 interposed therebetween. The mask 30 is removed after the epitaxial growth is finished.

Next, on the current block layer 16, light absorption layer 17, and BDR layer 18, the contact layer 19 is epitaxially grown by MOCVD. After the epitaxial growth is finished, the n-side electrode 20 and p-side electrode 21 are formed on the substrate 10 and contact layer 19, respectively. The semiconductor laser shown in FIGS. 1 and 2 is thus manufactured.

Hereinafter, the operation of the semiconductor laser according to the embodiment is described.

Voltage is applied across the n- and p-side electrodes 20 and 21 to inject carriers necessary for generating laser light into the active layer 13.

The pn junction between the p-type semiconductor layer and n-type current block layer 16 is reverse biased. Accordingly, the current does not flow through the current block layer 16 and is constricted to the stripe-shaped ridge structure. The current thus flows through the selected region of the active layer 13 (the region just under the stripe-shaped ridge structure). A region of the active layer 13 where current above a predetermined level flows functions as a gain region for the laser beam, but the other region functions as a "saturable absorption region R".

The saturable absorption region R functions as an absorption region not a gain region for laser light. The degree of absorption thereof (the amount of absorbed light) depends on the density of photoexcited carriers existing in the saturable absorption region R. Herein, the photoexcited carriers refer to electrons and holes which absorb the laser light to be excited from the valence band to the conduction band.

The amount of absorbed light decreases as the density of photoexcited carriers increases and increases as the density of photoexcited carriers decreases. If the amount of absorbed light in the saturable absorption region R periodically changes, the internal loss of the semiconductor laser device periodically changes, and the threshold current density necessary for laser oscillation periodically changes. This results in substantially the same effect as that obtained by changing the driving current although the driving current is maintained at constant, thus causing self-pulsation.

In order to stably cause self-pulsation, it is important to set the saturable absorption region R wide by preventing the current from spreading in the lateral direction of the active layer 13 and expanding a light spot S in the vertical direction.

Hereinafter, specific conditions to cause stable self-pulsation in the semiconductor laser according to the embodiment are examined using graphs of FIGS. 4 to 12.

Figure 4:
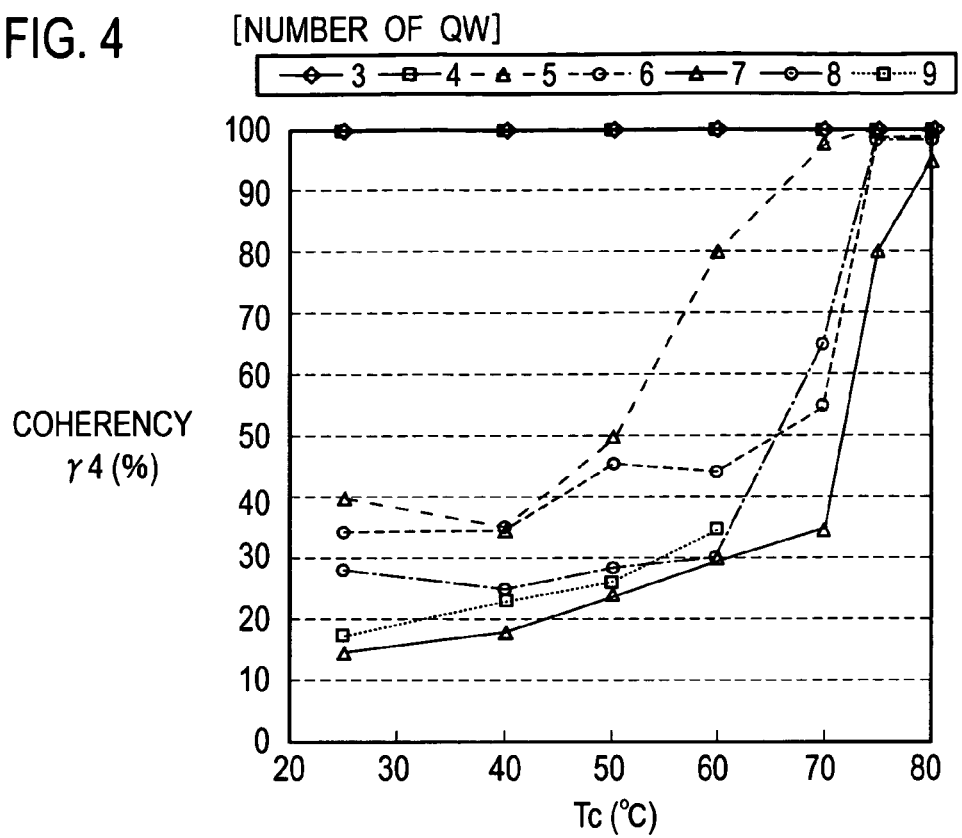
FIG. 4 is a graph showing dependencies of coherence and temperature change on the number of QWs in the semiconductor laser according to the embodiment of the present invention.

Using the graph of FIG. 4, an examination is conducted on the dependencies of coherence and temperature changes on the number of QWs of the active layer 13 in the semiconductor laser according to the embodiment. In this examination, semiconductor lasers including 3 to 9 QW pairs in the active layer 13 are used, and the temperature at which these semiconductor lasers are operated is varied while the other conditions are not varied. As a result of the examination, each of the semiconductor lasers having 3 or 4 QW pairs has high coherence even at low temperature and operates as a single mode laser. This is because the saturable absorption region R cannot be set wide. Moreover, in the semiconductor laser with the number of QWs increased to 9 pairs, the volume of the active layer 13 itself is increased by increasing the number of QWs, and the saturable absorption region R can be therefore set wide. This leads to the low coherence thereof. However, the increase in number of QWs raises the oscillation threshold, and the operating current of the semiconductor laser becomes high at high temperature due to self-heating, thus causing thermal runaway. Consequently, based on the graph of FIG. 4, the number of QW pairs is preferably 5 to 8 for the self pulsation and more preferably 6 or 7.

Figure 5:
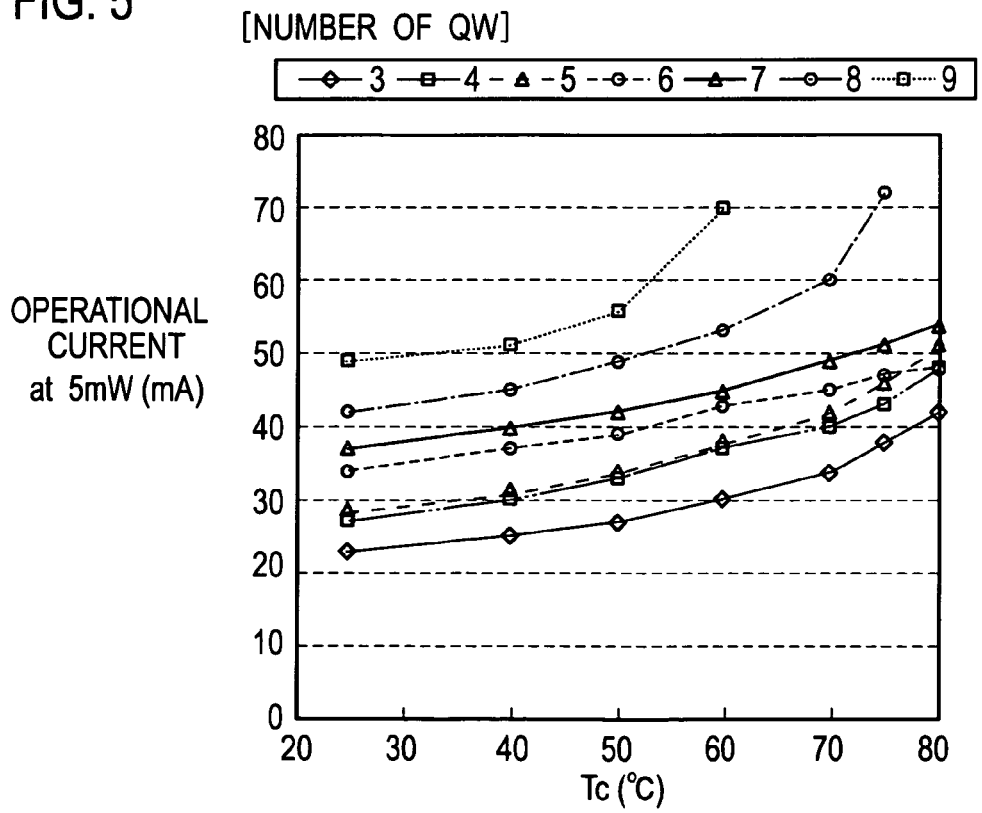
FIG. 5 is a graph showing dependencies of operating current and temperature change on the number of QWs in the semiconductor laser according to the embodiment of the present invention.

Using the graph of FIG. 5, an examination is conducted on the dependencies of operating current and temperature changes on the number of QWs of the active layer 13 in the semiconductor laser according to the embodiment. In this examination, semiconductor lasers including 3 to 9 QW pairs in the active layer 13 are used, and the temperature at which the these semiconductor lasers are operated is varied while the other conditions are not varied. As a result of the examination, as the number of QWs of the active layer 13 increases, the oscillation threshold increases. The semiconductor laser with the number of QWs of the active layer 13 increased to 9 pairs thermally run away at high temperature. Even if not thermally run away, the semiconductor laser sometimes operates as a single-mode laser due to the increase in operating current. When the semiconductor laser operates as a single-mode laser, the operating current does not increase higher than envisioned because single mode LDs have low operating current. The graph of FIG. 5 reveals that the active layer 13 preferably include not more than 9 QW pairs for performing pulsation.

Figure 6:
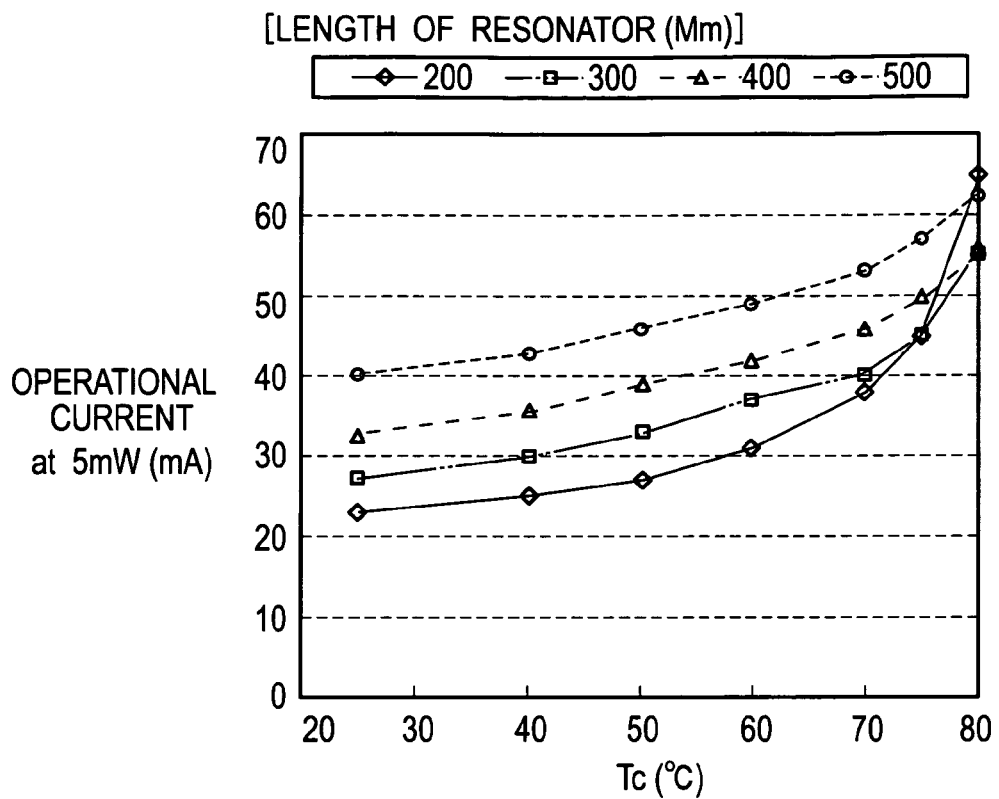
FIG. 6 is a graph showing dependencies of operating current and temperature change on resonator length in the semiconductor laser according to the embodiment of the present invention.

Using the graph of FIG. 6, an examination is conducted on the dependencies of operating current and temperature changes on the resonator length in the semiconductor laser according to the embodiment. In this examination, semiconductor lasers having resonator length L of 200, 300, 400, and 500 µm are used, and the temperature at which the semiconductor lasers are used are varied while the other conditions are not varied. As the resonator length L decreases, the operating current decreases because the oscillation threshold decreases. However, the operating current more significantly varies depending on the temperature because of the poor radiation performance. As the resonator length L increases, the oscillation threshold increases, and the operating current then increases. Depending on intended output power and operating current, the graph of FIG. 6 reveals that stable self pulsation can be obtained with the resonator length of about 250 to 500 µm.

Figure 7:
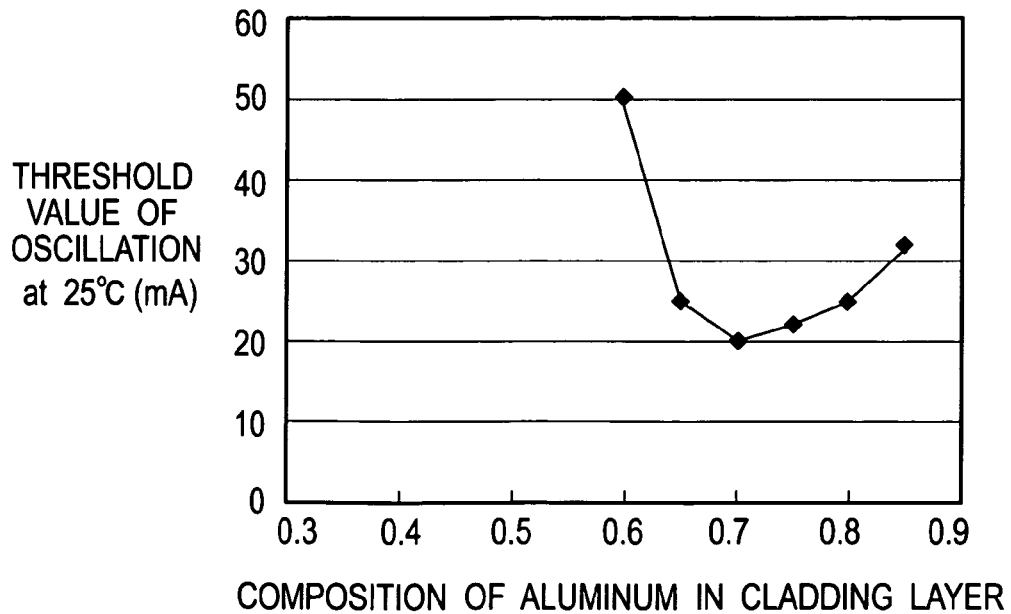
FIG. 7 is a graph showing a dependency of oscillation threshold on a composition ratio of aluminum of a p-type cladding layer in the semiconductor laser according to the embodiment of the present invention.

Using the graph of FIG. 7, an examination is conducted on the dependencies of the oscillation threshold on the composition ratio of Al of the p-type cladding layer 14 in the semiconductor laser according to the embodiment. In this examination, semiconductor lasers with the composition ratio of Al of the p-type cladding layer 14 varied are used under the conditions that: the composition ratio of Al of the current block layer 16 is 0.4; the resonator length L is 500 µm; and the active layer 13 includes 4 QW pairs. The current block layer 16 is generally configured to have a composition ratio of Al of about 0.4 to 0.6 and to have a band gap higher than that of the p-type cladding layer 14. The composition ratio of Al of the p-type cladding layer 14 is therefore set higher than that of the current block layer 16. As the composition ratio of Al of the current block layer 16 increases, light and carriers are increasingly confined, and the operating current then decreases. However, the higher composition ratio of Al makes it more difficult to dope p-type impurities. Moreover, the higher the composition ratio of Al of the current block layer 16, the more easily the current block layer 16 is oxidized, thus giving a disadvantage to the process of the semiconductor laser. As a result of the examination, as shown by the graph of FIG. 7, the oscillation thresholds are low at composition ratios of Al of the p-type cladding layer 14 of about 0.6 to 0.8. The optimal value of the composition ratio of Al of the p-type cladding layer 14 is therefore between about 0.6 and 0.8.

Figure 8:
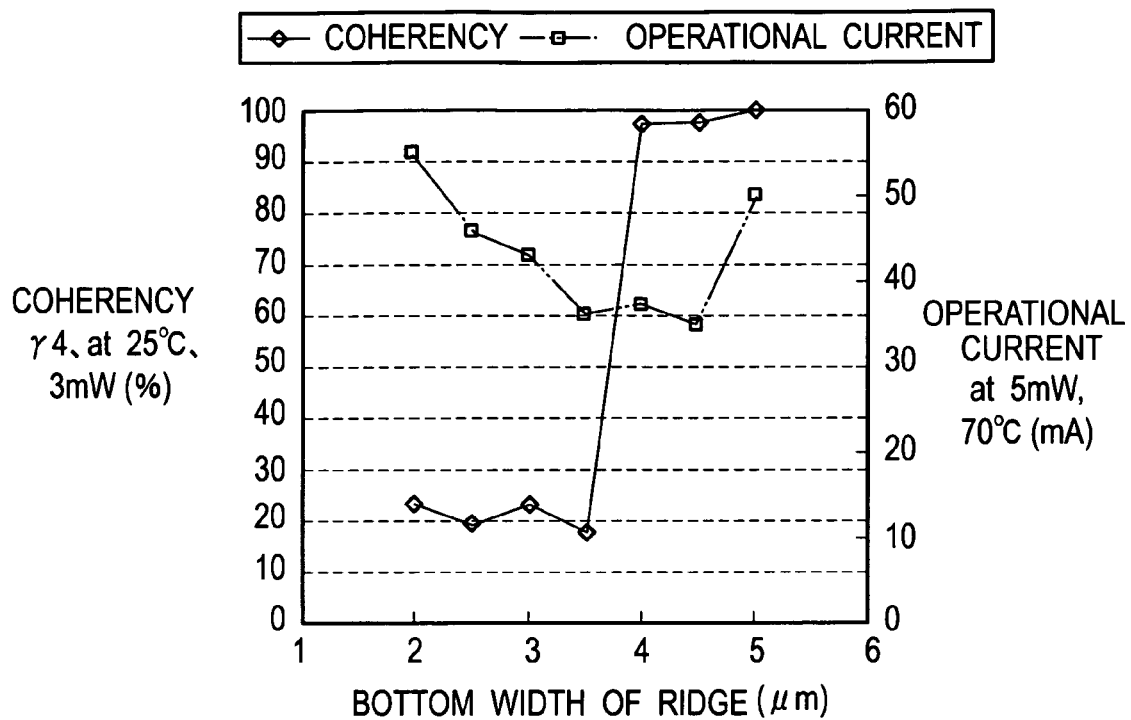
FIG. 8 is a graph showing dependencies of the coherence and operating current on width of the bottom of a ridge in the semiconductor laser according to the embodiment of the present invention.

Using the graph of FIG. 8, an examination is conducted on the dependencies of the coherence and operating current on the ridge bottom width $d_2$ in the semiconductor laser according to the embodiment. In this examination, semiconductor lasers with the ridge bottom width $d_2$ varied are used, and the other conditions are not varied. As for the dependency of the coherence on the ridge bottom width $d_2$ in the examination, the coherence increases when the ridge bottom width $d_2$ exceeds a certain value, and the semiconductor laser operates as a single-mode laser. As for the operating current on the ridge bottom width $d_2$, as the ridge bottom width $d_2$ decreases, the saturable absorption region R increases in size, but the serial resistance increases. Accordingly, the operating current increases, leading to degradation. As the ridge bottom width $d_2$ increases, the serial resistance decreases, and the operating current decreases. However, the increase in the ridge bottom width $d_2$ is more likely to cause a kink. Accordingly, excessively widening the ridge bottom width $d_2$ will increase the operating current, resulting in degradation. Based on these results, the ridge bottom width $d_2$ is preferably 1.5 to 4.0 µm and more preferably 2.0 to 3.5 µm.

Figure 9:
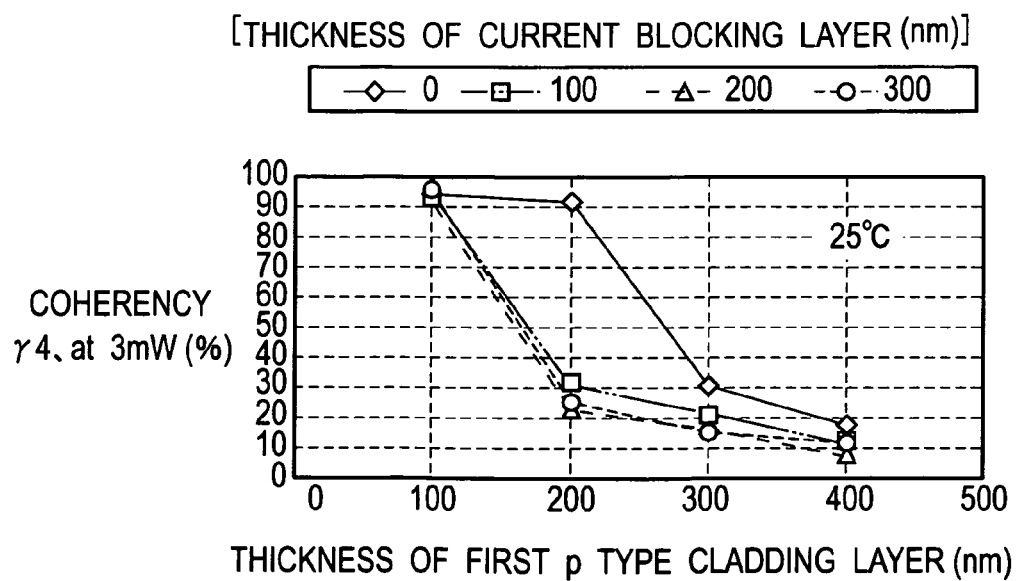
FIG. 9 is a graph showing dependencies of the coherence on thicknesses of a first p-type cladding layer and a current block layer at 25° C. in the semiconductor laser according to the embodiment of the present invention.
Figure 10:
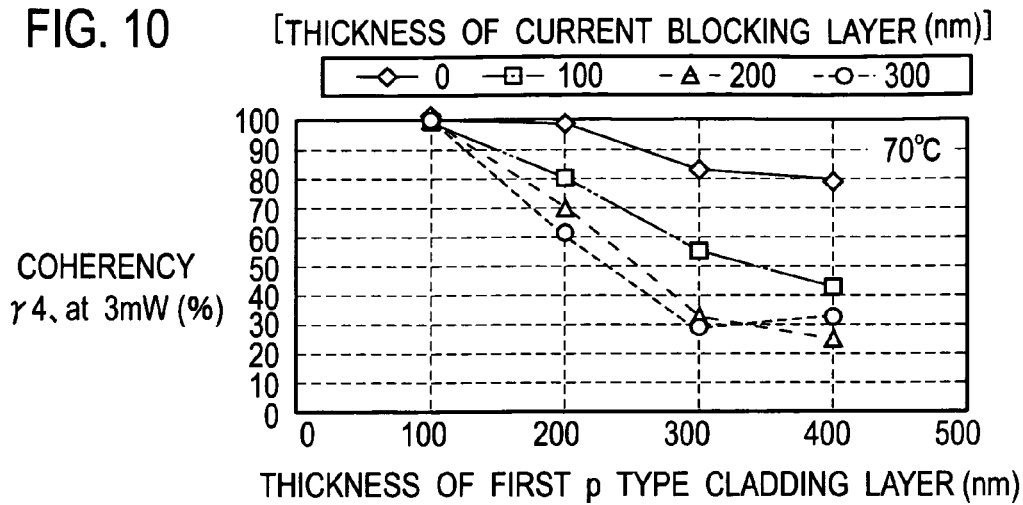
FIG. 10 is a graph showing dependencies of the coherence on the thicknesses of the first p-type cladding layer and current block layer at 70° C. in the semiconductor laser according to the embodiment of the present invention.

Using the graphs of FIGS. 9 and 10, an examination is conducted on the dependencies of the coherence at 25° C. and 70° C. on the thickness $t_1$ of the first p-type cladding layer 14a and the thickness $t_2$ of the current block layer 16 in the semiconductor laser according to the embodiment. In this examination, semiconductor lasers having values of the thickness $t_2$ of the current block layers 16 of 0, 100, 200, and 300 nm are used, and the thickness $t_1$ of the first p-type cladding layer 14a is varied while the other conditions are not varied. The graphs of FIGS. 9 and 10 show the cases at 25° C. and 70° C., respectively. As a result of the examination, in the case of the temperature of 25° C., for the thickness $t_2$ of the current block layer 16 of 0 nm (the current block layer 16 is not provided), the pulsation is caused when the thickness $t_1$ of the first p-type cladding layer 14a is not less than 300 nm because of the low coherence. For the values of the thickness $t_2$ of the current block layers 16 of 100, 200, and 300 nm, the pulsation is caused when the thickness $t_1$ of the first p-type cladding layer is not less than 200 nm because of the low coherence. In the case of the temperature of 70° C., for the values of the thickness $t_2$ of the current block layer 16 of 200 and 300 nm, the pulsation is caused when the thickness $t_1$ of the first p-type cladding layer 14a is not less than 300 nm because of the low coherence. Accordingly, to obtain stable pulsation, it is preferable that the thickness $t_1$ of the first p-type cladding layer is 200 to 500 nm while the thickness $t_2$ of the current block layer 16 is 100 to 400 nm. Moreover, the total thickness of the second conduction-type cladding layer (the thickness $t_1$ of the first p-type cladding layer) and the thickness $t_2$ of the current block layer 16 is preferably 400 to 800 nm.

Figure 11:
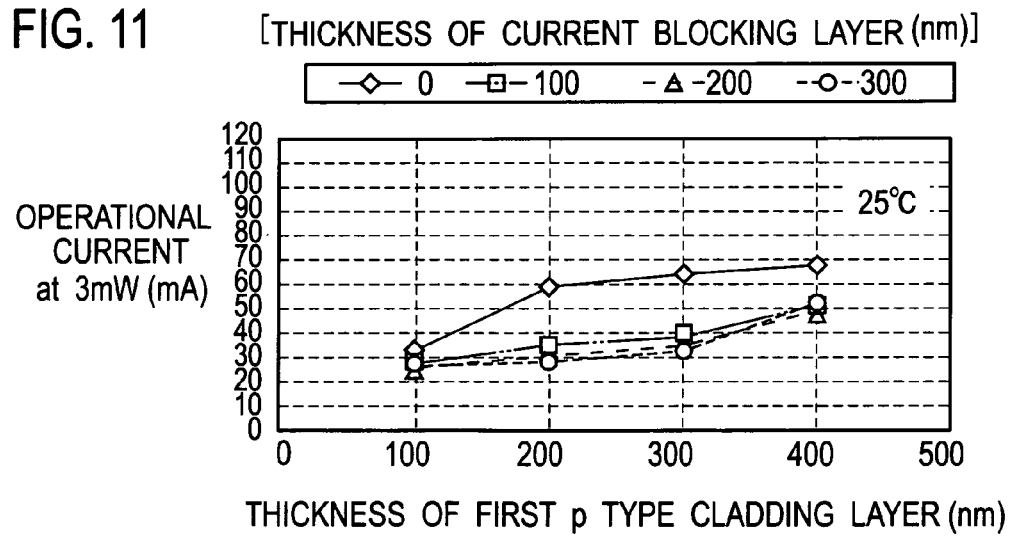
FIG. 11 is a graph showing dependencies of the operating current on the thicknesses of the first p-type cladding layer and current block layer at 25° C. in the semiconductor laser according to the embodiment of the present invention.
Figure 12:
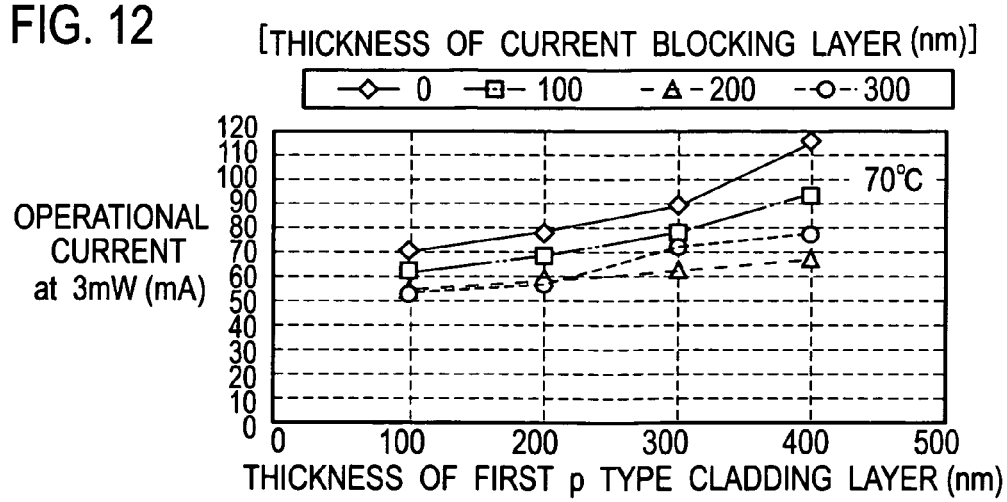
FIG. 12 is a graph showing dependencies of the operating current on the thicknesses of the first p-type cladding layer and current block layer at 70° C. in the semiconductor laser according to the embodiment of the present invention.

Using the graphs of FIGS. 11 and 12, an examination is conducted on the dependencies of the operating current at 25° C. and 70° C. on the thickness $t_1$ of the first p-type cladding layer 14a and the thickness $t_2$ of the current block layer 16 in the semiconductor laser according to the embodiment. In this examination, semiconductor lasers having values of the thickness $t_2$ of the current block layer 16 of 0, 100, 200, and 300 nm are used, and the thickness of light. Limiting the spread of current while keeping the light spot S widened allows the saturable absorption region R to be set wide, thus achieving stable self-pulsation.

Moreover, with the semiconductor laser according to the embodiment, the saturable absorption region R is set wide by providing the current block layer 16 and light absorption layer 17 independently of each other without increasing the volume of the active layer 13 contributing to an increase in operating current (increasing the number of QWs) or increasing the thickness t1 of the first p-type cladding layer 14. This can prevent the operating current from increasing. Furthermore, with the semiconductor laser according to the embodiment, pulsation can be caused at low operating current. Accordingly, the semiconductor laser can cause stable self-pulsation even when operating at high temperature without causing thermal runaway.

[Other Embodiments]

The present invention is described with the embodiment as described above, but it should not be understood that the description and drawings constituting a part of the disclosure limits the invention. Various alternative embodiments, examples, and operating techniques will be apparent to those skilled in the art $t_1$ of the first p-type cladding layer 14a is varied while the other conditions are not varied. The graphs of FIGS. 11 and 12 show the cases at 25° C. and 70° C., respectively. As a result of the examination, in the case of the temperature of 25° C., for the thickness $t_2$ of the current block laser 16 of 0 nm (the current block layer 16 is not provided), the operating current has a tendency to be high when the first p-type cladding layer 14 thereof is not less than 200 nm, thus resulting in degradation. Under the other conditions, the operating current remains stable and does not increase to high level. At the temperature of 70° C., the semiconductor lasers have higher operating currents as a whole. However, it is found that when the thickness $t_2$ of the current block layer 16 is 200 or 300 nm, the operating current is about 30 mA lower than that when the thickness $t_2$ of the current block layer 16 is 0 nm (the current block layer 16 is not provided). Accordingly, it is known that provision of the current block layer 16 can decrease the operating current.

With the semiconductor laser according to the embodiment of the present invention, the current block layer 16 having a function of transmitting the laser light generated at the active layer 13 and blocking only current is provided inside the light absorption layer 17 confining light. This makes it possible to strongly limit the spread of current without narrowing the light spot S as a spread from this disclosure.

For example, the semiconductor laser described in the embodiment is a single-wavelength semiconductor laser. The semiconductor laser according to the embodiment can be a monolithic or a multi-chip device including semiconductor lasers of two wavelengths outputting 650 nm laser light for reading DVD and 780 nm laser light for reading CD.

As described above, it should be understood that the present invention includes various embodiments not described. Accordingly, the present invention is limited only by the features of the invention in the claims proper from this disclosure.

Industrial Applicability

According to the present invention, a semiconductor laser which operates with low operating current and stably oscillates even at high temperature.

The invention claimed is:

1. A semiconductor laser, comprising:
   a substrate;
   a first conduction-type cladding layer provided on the substrate;
   an active layer provided on the first conduction-type cladding layer;
   a second conduction-type cladding layer which is provided on the active layer and composed of a compound containing Al, the second conduction-type cladding layer including a stripe-shaped ridge structure serving as a current channel;
   a current block layer which is provided on a surface of the second conduction-type cladding layer except an upper surface of the ridge structure and is composed of a compound containing Al, the current block layer having a composition ratio of Al not higher than that of the second conduction-type cladding layer, a difference in the composition ratio of Al between the current block layer and the second conductive cladding layer being not more than 5%;
   a light absorption layer provided so as to be directly contacted on a surface of the current block layer that absorbs light at a laser oscillation wavelength, the light absorption layer composed of a material having a band gap larger than that of the p-type cladding layer in order to serve as a current block layer confining an injected current; and
   a contact layer formed on respective upper surfaces of the current block layer, a band discontinuity reduction layer, and the light absorption layer,
   wherein an entire space on both of side surface sides of the ridge structure of the second conduction-type cladding layer and immediately below the contact layer is filled with the light absorption layer, inserting the current blocking layer between the ridge structure and the light absorption layer, and
   wherein a saturable absorption region formed in the active layer and also under the current block layer absorbs and releases the laser light generated at the active layer for self-pulsation, the saturable absorption region being different from the light absorption layer.

2. The semiconductor laser according to claim 1, wherein the active layer includes a multi-quantum well structure having 5 to 8 barrier-well layer pairs.

3. The semiconductor laser according to claim 1, wherein thickness of part of the second conductive cladding layer where the ridge structure is not provided is 200 to 500 nm, and thickness of the current block layer is 100 to 400 nm.

4. The semiconductor laser according to claim 1, wherein total thickness of the part of the second conductive cladding layer where the ridge structure is not provided and the current block layer is 400 to 800 nm.

5. The semiconductor laser according to claim 1, wherein width of a bottom of the ridge structure is 1.4 to 4.0 μm.

6. The semiconductor laser according to claim 1, wherein thickness of the active layer is 15 to 90 nm.

7. The semiconductor laser according to claim 1, wherein the length of the ridge structure in the stripe direction is 250 to 500 μm.

8. The semiconductor laser according to claim 1 further comprising a contact layer formed on respective upper surfaces of the current block layer, the ridge structure, and the light absorption layer.

9. The semiconductor laser according to claim 1, wherein the the band discontinuity reduction layer is formed on the upper surface of the ridge structure.

* * * * *